United States Patent
Mensch et al.

(10) Patent No.: US 6,876,090 B2
(45) Date of Patent: Apr. 5, 2005

(54) SEMICONDUCTOR CHIP AND METHOD FOR PRODUCING HOUSING

(75) Inventors: Hans-Georg Mensch, Neunburg (DE); Thomas Spöttl, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/649,410

(22) Filed: Aug. 27, 2003

(65) Prior Publication Data

US 2004/0159961 A1 Aug. 19, 2004

Related U.S. Application Data

(63) Continuation of application No. PCT/DE02/00714, filed on Feb. 27, 2002.

(30) Foreign Application Priority Data

Feb. 27, 2001 (DE) .......................................... 101 09 327

(51) Int. Cl.⁷ ............................................. H01L 23/28
(52) U.S. Cl. ....................................... 257/787; 257/680
(58) Field of Search ................................. 257/787, 680

(56) References Cited

U.S. PATENT DOCUMENTS

| | | | |
|---|---|---|---|
| 4,143,456 A | | 3/1979 | Inoue |
| 5,037,779 A | | 8/1991 | Whalley et al. |
| 5,219,712 A | * | 6/1993 | Evans et al. ................. 430/311 |
| 5,530,278 A | | 6/1996 | Jedicka et al. |
| 5,963,679 A | * | 10/1999 | Setlak ......................... 382/312 |
| 6,388,199 B1 | * | 5/2002 | Jiang et al. ................. 174/255 |

FOREIGN PATENT DOCUMENTS

| | | |
|---|---|---|
| EP | 0 319 175 A2 | 6/1989 |
| EP | 0 789 334 A2 | 8/1997 |
| JP | 61032535 A | 2/1986 |

* cited by examiner

*Primary Examiner*—David Nelms
*Assistant Examiner*—Tu-Tu Ho
(74) *Attorney, Agent, or Firm*—Laurence A. Greenberg; Werner H. Stemer; Gregory L. Mayback

(57) ABSTRACT

A selective encapsulation is produced which covers the connection pads and bonding wires with a potting compound and leaves free active regions, in particular a bearing area for a finger in a fingerprint sensor, by the chip surface being selectively adapted by different roughness or coating and/or the viscosity of the potting compound being altered by irradiation thereof.

5 Claims, 1 Drawing Sheet

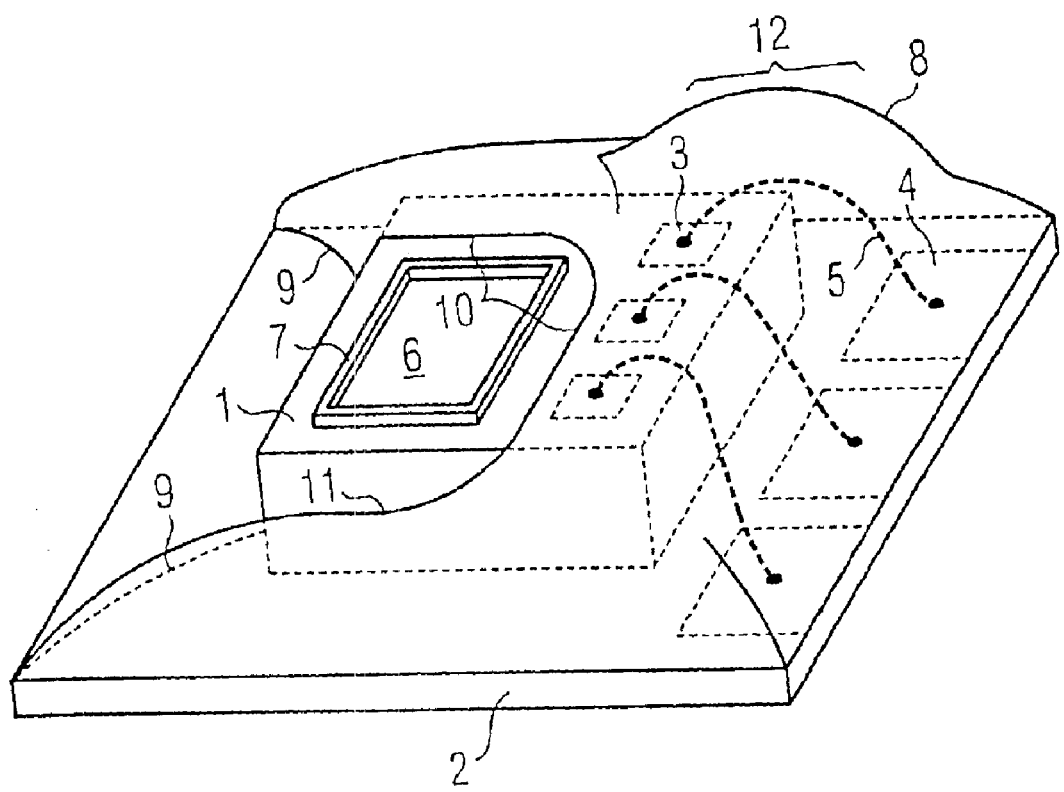

SEMICONDUCTOR CHIP AND METHOD FOR PRODUCING HOUSING

CROSS-REFERENCE TO RELATED APPLICATION

This application is a continuation of copending International Application No. PCT/DE02/00714, filed Feb. 27, 2002, which designated the United States and which was not published in English.

BACKGROUND OF THE INVENTION

Field of the Invention

The invention lies in the semiconductor technology and semiconductor processing fields. More specifically, the present invention relates to a semiconductor chip which is partially provided, after mounting on a chip carrier, with an encapsulation of the connection pads and/or the bonding wires. The encapsulation is referred to as a housing. Specific active regions of the top side remain free. The invention also pertains to a production method for such a housing.

The active circuits of semiconductor chips are usually connected to a chip carrier via the connection pads, referred to as bonding pads, the semiconductor chip being mounted on the chip carrier. Customary connection methods, for example, are wire bonding, in which the connection pads of the semiconductor chip and the connection pads of the chip carrier are connected to one another in pairs by soldered-on wires, and flip-chip bonding, in which the top-side contacts of the semiconductor chip are fitted directly on assigned contact areas of the chip carrier.

These connections are normally good enough in electrical terms, but not stable enough in mechanical terms. For this reason, a mechanical protection of the semiconductor chip, in particular for the electrical connections, is usually provided. Therefore, the semiconductor chip is usually enclosed by injection-molding in a potting compound or coverage with an encapsulation compound in a so-called housing. In this case, all connections between the chip and the chip carrier and at least the entire active region of the chip are encapsulated.

If specific active regions of the semiconductor chip are not permitted to be encapsulated for reasons of the mode of operation, e.g. the bearing area for a finger in a fingerprint sensor, the housing can be limited to the remaining regions of the top side of the semiconductor chip. Since the bonding pads are generally situated close to the active regions on the chips and the bonding pads must always be encapsulated, what is required is an enclosure of the chip in a housing in which closely adjacent regions of the top side of the chip are in some instances left free and in some instances encapsulated by the housing.

That can be done by fitting, on the chip carrier provided with the chip, a barrier between those portions of the top side of the chip which are intended to be covered and the remaining portions of the top side of the chip, which are intended to remain free. During the application of the potting compound or encapsulation compound to the bonding pads and wire connections, this barrier prevents the potting compound or encapsulation compound from flowing into those active chip regions which are intended to remain free. The barrier can subsequently be removed. However, the additional fitting of a barrier of this type requires additional effort and thus additional costs; in particular cases, a selective encapsulation of the semiconductor chip can thus be realized only with difficulty, or not at all.

SUMMARY OF THE INVENTION

It is accordingly an object of the invention to provide a semiconductor chip and a method for fabricating a housing, which overcome the above-mentioned disadvantages of the heretofore-known devices and methods of this general type and which specify an improved possibility for a selective encapsulation of a semiconductor chip.

With the foregoing and other objects in view there is provided, in accordance with the invention, a semiconductor chip, comprising:

a top side with a surface;

the top side having a first portion to be covered by a potting compound or encapsulation compound of a housing;

the top side having a second portion to remain free of the potting compound or encapsulation compound;

a facilitator selected from the group consisting of a material applied thereon and an areal structure formed thereon for defining a variation in a degree of wettability or adhesion characteristics relative to the potting compound or the encapsulation compound for the surface in the first portion and the surface in the second portion, the facilitator rendering wetting, flowing, or adhesion of the potting compound or encapsulation compound in the second portion of the top side more difficult than in the first portion, and promoting an application of the potting compound or encapsulation compound exclusively on the first portion.

In accordance with an added feature of the invention, the first portion of the top side includes connection pads and/or bonding wires and the second portion of the top side includes at least one active component. In a preferred embodiment, the top side of the surface that is left free contains a bearing area for a finger, i.e., the chip may contain a finger print sensor circuit.

With the above and other objects in view there is also provided, in accordance with the invention, a method for producing a housing for a semiconductor chip, which comprises:

preliminarily processing a surface of the semiconductor chip in a second portion of a top side thereof by coating with a material and/or areally structuring to form a configuration thereon rendering wetting, flowing, or adhesion of the potting compound or encapsulation compound more difficult than in a first portion of the top side, and promoting application of the potting compound or encapsulation compound exclusively on the first portion of the top side; and subsequently applying the potting compound or encapsulation compound to the top side of the semiconductor chip and thereby:

covering the first portion of the top side with the potting compound or encapsulation compound; and leaving the second portion of the top side free of the potting compound or encapsulation compound.

In accordance with a concomitant feature of the invention, the method comprises, prior to application of the potting compound or encapsulation compound, covering the second portion of the top side of the semiconductor chip with a material entering into a chemical reaction with the potting compound or encapsulation compound or initiates and/or promotes a chemical reaction between a further applied material and the potting compound or encapsulation compound, in such a way that this chemical reaction stops flowing of the potting compound or encapsulation compound on this portion of the top side or makes it more difficult for the potting compound or encapsulation compound to adhere on this portion of the top side.

In other words, according to the invention the selective encapsulation is achieved by means of a specially designed semiconductor chip with a selectively adapted surface or by means of a method for the application of the potting compound or encapsulation compound in which the potting compound or encapsulation compound is prevented from flowing onto those portions of the chip surface which are to be left free.

A semiconductor chip according to the invention has a first portion of the top side, which is provided for being covered by a potting compound or encapsulation compound of a housing, and a second portion of the top side, which is provided for remaining free of the potting compound or encapsulation compound. The surface of the semiconductor chip in the first portion and in the second portion of the top side are differentiated from one another in such a way as to promote application of the potting compound or encapsulation compound exclusively to the first portion. The portions can be differentiated from one another by an areal selective adaptation of the respective surfaces to the different requirements or by means of a structural delimitation by means of a barrier formed on the surface of the semiconductor chip.

A selective adaptation of the chip surface can be effected by achieving different levels of wettability or different adhesion properties of the potting compound or encapsulation compound used by means of different materials and/or structures at the chip surface in the portion to be covered by the potting compound or encapsulation compound and that portion of the top side of the semiconductor chip which is to be left free. It is thus possible to limit flowing of the potting compound or encapsulation compound to part of the surface of the semiconductor chip. The other possibility mentioned for differentiating the portions of the chip surface by means of a structural delimitation consists in the demarcation of that region of the top side of the chip which is to be covered with the housing by means of a barrier structured directly on the chip surface, which barrier is formed in particular as a dam or trench.

In addition to or instead of the selective adaptation or structural delimitation of the portions of the surface of the semiconductor chip, it is possible, during the production of the housing by the method according to the invention, by means of irradiation effected in regions and/or at times, at least in regions and/or at least for a short time to increase the viscosity of the potting compound or encapsulation compound and/or to reduce the adhesion of the potting compound or encapsulation compound, in order to control the propagation of the potting compound or encapsulation compound and thus to prevent the potting compound or encapsulation from flowing onto that portion of the top side of the semiconductor chip which is to be left free.

It is also possible to use a potting compound or encapsulation compound which contains a multicomponent system in which irradiation effected in regions and/or at times can be used to initiate and/or maintain a chemical reaction which increases the viscosity of the potting compound or encapsulation compound and/or reduces the adhesion of the potting compound or encapsulation compound on the surface of the semiconductor chip, in order to control the propagation of the potting compound or encapsulation compound and thus to prevent the potting compound or encapsulation compound from flowing onto that portion of the top side of the semiconductor chip which is to be left free.

Instead of or in addition to this, it is possible, on that portion of the top side of the semiconductor chip which is to be left free, to apply a material to the surface of the semiconductor chip which enters into a chemical reaction with the potting compound or encapsulation compound or initiates or promotes a chemical reaction between the potting compound or encapsulation compound and a further applied material. Such a chemical reaction can stop flowing of the potting compound or encapsulation compound on the relevant portion of the top side of the semiconductor chip, or at least make it more difficult, or prevent adhesion of the potting compound or encapsulation compound on the surface of the semiconductor chip on this portion of the top side of the semiconductor chip. By this means too, it is thus possible to control the propagation of the potting compound or encapsulation compound and thus to prevent the potting compound or encapsulation compound from flowing onto that portion of the top side of the semiconductor chip which is to be left free.

Other features which are considered as characteristic for the invention are set forth in the appended claims.

Although the invention is illustrated and described herein as embodied in a semiconductor chip and production method for a housing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWINGS

The FIGURE is a perspective diagram of a semiconductor chip with an integrated circuit mounted on a carrier.

DESCRIPTION OF THE PREFERRED EMBODIMENTS

Referring now to the sole FIGURE of the drawing in detail, there is shown a semiconductor chip 1 with an integrated circuit which is mounted on a carrier 2. The semiconductor chip has connection pads 3 (bonding pads), which are electrically conductively connected to connection pads 4 on the carrier 2 via bonding wires 5. The connection pads and bonding wires need to be mechanically protected. This is effected in this case by a suitable covering comprising a potting compound or encapsulation compound.

However, there is situated on the semiconductor chip 1 an active region which is not permitted to be covered because it must be externally accessible for a function of the semiconductor chip. In the example illustrated in the FIGURE, that is a bearing area 6 for a finger, which is bordered by a dam 7. The bearing area 6 is part of a fingerprint sensor for which part of the circuit integrated in the semiconductor chip is provided. Therefore, the covering for the bonding wires 5, i.e., the potting compound or encapsulation compound 8, is not permitted to cover the bearing area 6.

The FIGURE indicates that, although the potting compound or encapsulation compound 8 covers and thus protects the connection pads 3, 4 and the bonding wires 5 in a protected region 12 of the top side of the semiconductor chip 1, the entire semiconductor chip 1 is not covered by the potting compound or encapsulation compound 8. Therefore, there are situated on the top sides of the semiconductor chip 1 and of the carrier 2 edges 9, 10, 11 of the applied potting compound or encapsulation compound 8 along which runs the boundary between the covered portion of the top sides of the semiconductor chip and of the carrier and the left-free portion of the top sides of the semiconductor chip and of the carrier. A region which is present on the top side of the semiconductor chip and, in this example, comprises the bearing area 6 for a finger, is thereby left free and accessible.

The edge 10 of the potting compound or encapsulation compound 8 which runs on the top side of the semiconductor chip 1 is therefore formed between the connection pads 3 of the semiconductor chip and the bearing area 6 in such a way that the connection pads 3 including the bonding wires 5 are completely covered in the protective region 12, while the bearing area 6 is left free in its entirety. The exact course of the edge 9 of the potting compound or encapsulation compound 8 present on the top side of the carrier 2 and of the edge 11 of the potting compound or encapsulation compound 8 present on the sides or edges of the semiconductor chip 1 is unimportant in this exemplary embodiment.

In contrast to the example illustrated in the FIGURE, it is possible according to the invention for the edge 10 of the potting compound or encapsulation compound 8 which runs on the top side of the semiconductor chip 1 to be formed in a rectilinear manner. In particular, the edge 10 can run along the boundary of the bearing area 6 to be left free, that is to say in this case specifically along the dam 7, which can be used, during the production of the housing, as a structural delimitation which prevents the potting compound or encapsulation compound from flowing onto the bearing area 6. The FIGURE is only intended to show, in principle, that the top side of the semiconductor chip 1 is divided into a portion which is covered by the potting compound or encapsulation compound and a portion which is left free of the potting compound or encapsulation compound.

The demarcation of the potting compound or encapsulation compound with respect to the selective encapsulation is achieved according to the invention by means of a selective adaptation of the surface of the semiconductor chip, by means of a structural delimitation of the different portions which is provided on the surface and/or by means of the production method according to the invention. Any change in the surface characteristics (e.g. wettability, adhesive potential, etc.), any chemical change in the surface materials to change those characteristics, or any structure that facilitates (prevents or promotes) the specifically desired behavior of the potting compound or encapsulation is referred to herein as a "facilitator."

In the case of a selective adaptation of the surface of the semiconductor chip, in the portion which is to be left free of the potting compound or encapsulation compound, the surface can be configured, according to the invention, in such a way that wetting, flowing or adhesion, of the potting compound or encapsulation compound is prevented there, or at least made more difficult. That is achieved in particular by means of a locally delimited coating of the surface of the semiconductor chip with a suitable material or by means of an areal structuring, such as, for example, a roughening, of the surface of the semiconductor chip in the relevant portion of the top side of the semiconductor chip. During the application of the potting compound or encapsulation compound, as a consequence of the selective adaptation, it is automatically the case that only that portion of the top side of the semiconductor chip which is to be covered is covered, in which the surface of the semiconductor chip promotes wetting, flowing or adhesion of the potting compound or encapsulation compound, or at least does not make it more difficult.

A structural delimitation of the portions of the top side of the semiconductor chip that are to be covered and, respectively, left free by means of a barrier applied to the surface of the semiconductor chip is, for example, a dam or trench. The dam 7 depicted in the FIGURE, which, in the example illustrated, surrounds the bearing area 6—to be left free—all around, can be provided according to the invention for stopping the flowing of the potting compound or encapsulation compound. The edge 10 of the potting compound or encapsulation compound which is present on the top side of the semiconductor chip then runs along this dam. Instead of a dam, a trench may be present which, in particular in the case of in any event only moderate flowing of the potting compound or encapsulation compound, suffices for producing a precisely defined edge as demarcation of the potting compound or encapsulation compound along an envisaged boundary of that portion of the top side of the semiconductor chip which is to be left free. That may be the case, for example, if only a small quantity of the potting compound or encapsulation compound is applied or injected and/or if the surface of the semiconductor chip is selectively adapted according to the invention.

In the exemplary embodiment of the semiconductor chip according to the invention in accordance with the FIGURE, what is achieved by the different configuration of the surface of the semiconductor chip in the different portions is that the potting compound or encapsulation compound covers only the one portion. Moreover, in an exemplary embodiment in which a dam or trench is provided on the surface as structural delimitation for the demarcation of the potting compound or encapsulation compound, in that portion of the top side of the semiconductor chip which is to be left free, as additional means, the surface may be provided with a coating made of a material which makes wetting or adhesion of the potting compound or encapsulation compound more difficult. Instead of this or in addition, the surface can be roughened or made uneven in a suitable manner in this region of the top side of the semiconductor chip.

The novel method according to the invention for producing a housing with selective encapsulation comprises, in a preferred refinement, a method step wherein the surface of the semiconductor chip in the portion to be left free is prepared in such a way that, during the application of the potting compound or encapsulation compound, it is easily possible to prevent this portion of the top side from being covered. The selective preparation of the relevant regions of the surface of the semiconductor chip is done using one or more of the procedures described above, by a suitable material as coating and/or a suitable areal structure being selectively applied to the surface or by, instead of this or in addition, a barrier for delimiting the portion which is to be covered with the potting compound or encapsulation compound being produced on the surface.

A further possibility for the production method consists in altering the progression properties of the potting compound or encapsulation compound during the application by means of irradiation effected at times and/or in regions. The irradiation can, in particular increase the viscosity of the potting compound or encapsulation compound by means of a physical action and/or reduce the adhesion of the potting compound or encapsulation compound on the surface of the semiconductor chip. As a result, the flowing or adhesion of the potting compound or encapsulation compound can be controlled in a targeted manner such that the potting compound or encapsulation compound propagates only on that portion of the top side of the semiconductor chip which is to be covered.

Instead of or in addition to this, an irradiation can initiate a chemical reaction in the potting compound or encapsulation compound and/or promote the course thereof, for example by means of a shift in the reaction equilibrium or a catalyst effect. As a result, it is possible to alter the potting compound or encapsulation compound during the application in such a way that it does not cover that portion of the top side of the semiconductor chip which is to be left free.

In the implementation of the method, the potting compound or encapsulation compound is preferably applied from one side of the assembly of the semiconductor chip on the carrier in such a way that firstly those portions of the top side of the semiconductor chip and, if appropriate, of the carrier which are to be covered are covered. In this case the potting compound or encapsulation compound is irradiated in a timely manner to change its property in such a way that the top side of the semiconductor chip is not covered in a manner that goes beyond this.

Depending on a respective exemplary embodiment, the irradiation can effect a temporary increase in the viscosity or brief curing of the potting compound or encapsulation compound; however, the property of the potting compound or encapsulation compound can also be permanently altered as a result of this, in particular when using a multicomponent system which is contained in the potting compound or encapsulation compound and in which a chemical reaction is initiated. A component for a chemical reaction, in particular e.g. a catalyst provided therefor, can be applied to the relevant portion of the chip surface before the potting compound or encapsulation compound is applied.

In terms of outlay, the method according to the invention differs from previous production methods of chip housings only to an insignificant extent. The semiconductor chip can be applied on a chip carrier in the customary manner, whereupon the electrical connections are produced by customary methods (e.g. wire bonding). A protective cap may additionally be applied above the chip, which cap leaves free the active regions of the chip which are not to be encapsulated. The regions to be protected are then selectively encapsulated according to the invention. In this case, a selective adaptation of the surface of the semiconductor chip significantly facilitates the production of the selective encapsulation. The particular advantage of the invention is that there is no need for structural measures with which the semiconductor chip is processed after mounting on the chip carrier.

We claim:

1. A semiconductor chip, comprising:
   a top side with a surface;
   said top side having a first portion to be covered by a potting compound or encapsulation compound of a housing;
   said top side having a second portion to remain free at the potting compound or encapsulation compound
   a facilitator provided on said top side of the chip between said top side of the chip and the potting compound or the encapsulation compound, said facilitator selected from the group consisting of a material applied thereon and an areal structure formed thereon for defining a variation in a degree of wettability or adhesion characteristics relative to the potting compound or the encapsulation compound for said surface in said first portion and said surface in said second portion, said facilitator rendering wetting, flowing, or adhesion of the potting compound or encapsulation compound in said second portion of said top side more difficult than in said first portion, and promoting an application of the potting compound or encapsulation compound exclusively on said first portion.

2. The semiconductor chip according to claim 1, wherein said first portion of said top side includes connection pads and/or bonding wires and said second portion of said top side includes at least one active component.

3. The semiconductor chip according to claim 2, wherein said second portion of said top side comprises a bearing area for a finger.

4. A method for producing a housing for a semiconductor chip, which comprises:
   selecting a potting compound or encapsulation compound for forming a housing for the semiconductor chip;
   processing a surface of the semiconductor chip in a second portion of a top side thereof with at least one process selected from the group consisting of coating with a material and areally structuring to form a configuration thereon rendering wetting, flowing, or adhesion of the potting compound or encapsulation compound more difficult than in a first portion of the top side, and promoting application of the potting compound or encapsulation compound exclusively on the first portion of the top side; and
   subsequently applying the potting compound or encapsulation compound to the cop side of the semiconductor chip and thereby;
   covering the first portion of the top side with the potting compound or encapsulation compound; and
   leaving the second portion of the top side free of the potting compound or encapsulation compound.

5. The method according to claim 4, which comprises, prior to application of the potting compound or encapsulation compound, covering the second portion of the top side of the semiconductor chip with a material entering into a chemical reaction with the potting compound or encapsulation compound or initiates and/or promotes a chemical reaction between a further applied material and the potting compound or encapsulation compound, in such a way that this chemical reaction stops flowing of the potting compound or encapsulation compound on this portion of the top side or makes it more difficult for the potting compound or encapsulation compound to adhere on this portion of the top side.

* * * * *